(12) United States Patent
Lee et al.

(10) Patent No.: US 7,401,273 B2
(45) Date of Patent: Jul. 15, 2008

(54) RECOVERY FROM ERRORS IN A DATA PROCESSING APPARATUS

(75) Inventors: Seokwoo Lee, Ann Arbor, MI (US);
Todd Michael Austin, Ann Arbor, MI (US)

(73) Assignees: ARM Limited, Cambridge (GB);
University of Michigan, Ann Arbor, MI (US)

( * ) Notice: Subject to any disclaimer, the term of this patent is extended or adjusted under 35 U.S.C. 154(b) by 714 days.

(21) Appl. No.: 11/050,446

(22) Filed: Feb. 4, 2005

(65) Prior Publication Data
US 2005/0207521 A1    Sep. 22, 2005

Related U.S. Application Data

(63) Continuation-in-part of application No. 10/392,382, filed on Mar. 20, 2003, now Pat. No. 7,278,080.

(51) Int. Cl.
*G01R 31/28* (2006.01)
*G11B 20/20* (2006.01)

(52) U.S. Cl. ........................... 714/724; 714/700
(58) Field of Classification Search .................. None
See application file for complete search history.

(56) References Cited

U.S. PATENT DOCUMENTS

| | | | | |
|---|---|---|---|---|
| 5,504,859 | A * | 4/1996 | Gustafson et al. | 714/11 |
| 5,553,232 | A * | 9/1996 | Wilhite et al. | 714/6 |
| 6,772,388 | B2 * | 8/2004 | Cooper et al. | 714/774 |
| 6,799,292 | B2 * | 9/2004 | Takeoka et al. | 714/774 |
| 6,834,367 | B2 * | 12/2004 | Bonneau et al. | 714/738 |
| 7,085,993 | B2 * | 8/2006 | Goodnow et al. | 714/798 |
| 7,162,661 | B2 * | 1/2007 | Mudge et al. | 714/10 |

OTHER PUBLICATIONS

N Kanekawa et al, "Fault Detection and Recovery Coverage Improvement by Clock Synchronized Supplicated Systems with Optimal Time Diversity" Fault-Tolerant Computing, Jun. 1998, pp. 196-200.*
D. Mavis et al., "Soft Error Rate Mitigation Techniques for Modern Micorcircuits", 40th Annual International Reliability Physics Symposium, Dallas, Texas 2002, pp. 216-225.

* cited by examiner

*Primary Examiner*—Cynthia Britt
(74) *Attorney, Agent, or Firm*—Nixon & Vanderhye P.C.

(57) ABSTRACT

A data processing apparatus and method are provided for recovering from errors in the data processing apparatus. The data processing apparatus comprises processing logic operable to perform a data processing operation, and a plurality of sampling circuits, each sampling circuit being located at a predetermined point in the processing logic and operable to sample a value of an associated digital signal generated by the processing logic at that predetermined point. Each of the sampling circuits includes a backup latch for storing a backup copy of the associated digital signal value, and at least one of the sampling circuits is operable to temporally sample the value of the associated digital signal at a first time and at at least one later time, and to store as a backup copy a selected one of the sampled values representing a correct value. The value of the associated digital signal sampled at the first time is initially output from that sampling circuit, and that sampling circuit is operable to determine an occurrence of an error in the value of the associated digital signal sampled at the first time, and to issue an error signal upon determination of that error. The data processing apparatus further comprises error recovery logic operable in response to the error signal to implement a recovery procedure during which selected sampling circuits output as their sampled associated digital signal value the value stored in their backup latch.

12 Claims, 9 Drawing Sheets

RECOVERY FROM ERRORS IN A DATA PROCESSING APPARATUS

This application is a continuation-in-part of U.S. Ser. No. 10/392,382, filed 20 Mar. 2003 now U.S. Pat. No. 7,278,080. The entire contents of this application is incorporated herein by reference.

FIELD OF THE INVENTION

The present invention relates to techniques for recovering from errors detected in a data processing apparatus.

DESCRIPTION OF THE PRIOR ART

It is known to provide a data processing apparatus that has processing logic which can be considered to be formed of a series of serially connected processing stages, one example being a pipelined processing logic circuit. Between each of the stages is a signal-capture element (also referred to herein as a latch) into which one or more signal values are stored. The logic of each processing stage is responsive to input values received from other processing stages or elsewhere to generate output signal values to be stored in an associated output latch. The time taken for the logic to complete its processing operations determines the speed at which the data processing apparatus may operate. If the logic of all stages is able to complete its processing operation in a short period of time, then the signal values may be rapidly advanced through the output latches resulting in high speed processing. Such a known system does not advance signals between stages more rapidly than the slowest processing stage logic is able to perform its processing operation of receiving input signals and generating appropriate output signals. This limits the maximum performance of the system.

In some situations it is desired to process data as rapidly as possible and accordingly the processing stages will be driven so as to advance their processing operations at as rapid a rate as possible until the slowest of the processing stages is unable to keep pace. In other situations, the power consumption of the data processing apparatus is more important than the processing rate and the operating voltage of the data processing apparatus will be reduced so as to reduce power consumption up to the point at which the slowest of the processing stages is again no longer able to keep pace. Both of these situations in which the slowest of the processing stages is unable to keep pace will give rise to the occurrence of processing errors (i.e. systematic errors), and hence conventional systems have built in safety margins in selection of clock frequency, etc to ensure that such errors do not occur.

In contrast to such conventional techniques, commonly-assigned U.S. Pat. Publication No. U.S. 2004-0199821 describes an integrated circuit in which a sampling circuit is arranged to sample a digital signal value at a first time and at a second later time, with a difference in the digital signal value sampled being indicative of an error in operation of the integrated circuit. Error repair logic is then used to repair the error in operation. This technique recognises that the operation of the processing stages themselves can be directly monitored to find the limiting conditions in which they fail. When actual failures occur, then these failures can be corrected such that incorrect operation overall is not produced. It has been found that the performance advantages achieved by the avoidance of excessively cautious performance margins in the previous conventional approaches compared with the direct observation of the failure point when using the technique of the above US patent application more than compensates for the additional time and power consumed in recovering the system when a failure does occur.

However, in accordance with the techniques described in U.S. patent publication no. U.S. 2004-0199821, it is necessary to perform error detection and any necessary error recovery within a single clock cycle. In particular, considering the pipeline example described in that U.S. patent publication, a global recovery technique is performed in which on detection of an error, the entire pipeline is stalled, the correct data is reinserted into the relevant pipeline stages, and a global recovery signal is then asserted. The global recovery signal is asserted by performing a sequence of steps which comprise detecting a local error in a particular sampling circuit, propagating that local error to a logical OR gate, evaluating that OR gate's inputs to determine assertion of the global recovery signal, and then propagating the global error recovery signal to the relevant sampling circuits. Given that half of a clock cycle may be required to detect the presence of the error, this only leaves half a cycle for signal propagation of the global recovery signal to the required sampling circuits.

Given current technology trends, namely increasing frequency and more complex design requiring a larger number of sampling circuits, the above recovery process may not be feasible in future systems. In particular, it is likely that in the future the half cycle left for performing recovery may not provide enough time for the system to completely recover from the error.

Accordingly, it would be desirable to provide a technique for recovering from errors in a data processing system, which alleviates the above time constraint.

SUMMARY OF THE INVENTION

Viewed from a first aspect, the present invention provides a data processing apparatus comprising: processing logic operable to perform a data processing operation; a plurality of sampling circuits, each sampling circuit being located at a predetermined point in the processing logic and operable to sample a value of an associated digital signal generated by the processing logic at that predetermined point; each of said sampling circuits including a backup latch operable to store a backup copy of the associated digital signal value, and at least one of the sampling circuits being operable to temporally sample the value of the associated digital signal at a first time and at at least one later time and to store as the backup copy a selected one of the sampled values representing a correct value, the value of the associated digital signal sampled at the first time being initially output from that sampling circuit; the at least one of the sampling circuits being operable to determine an occurrence of an error in the value of the associated digital signal sampled at the first time, and to issue an error signal upon determination of said error, the data processing apparatus further comprising: error recovery logic operable in response to the error signal to implement a recovery procedure during which selected sampling circuits are operable to output as their sampled associated digital signal value the value stored in their backup latch.

In accordance with the present invention, each of the sampling circuits includes a backup latch operable to store a backup copy of the digital signal value sampled by that sampling circuit. The term latch used herein encompasses any circuit element operable to store a signal value irrespective of triggering, clock and other requirements. At least one of the sampling circuits temporally samples its associated digital signal value at a first time and at at least one later time, and a selected one of those sampled values representing a correct value is stored as a backup copy. The backup copy may be the correct value itself, or a value from which the correct value can be derived. To enable high performance, the value of the associated digital signal sampled at the first time is initially output from the sampling circuit.

It is possible that this value initially output from the sampling circuit may include an error. This error may be a processing error resulting from sampling the signal before the logic producing that signal had finished performing the required processing operation, or alternatively may be some random error, also known as a soft error. One example of such a soft error is a single event upset (SEU). An SEU is a random error (bit-flip) induced by an ionising particle such as a cosmic ray or an alpha particle in a device. The change of state is transient i.e. pulse-like, so a reset or rewriting of the device causes normal behavior thereafter.

The at least one sampling circuit is arranged to determine the occurrence of such an error and to issue an error signal when such an error is detected. The data processing apparatus further comprises error recovery logic which, in response to the error signal, implements a recovery procedure during which selected sampling circuits output as their sampled associated digital signal value the value stored in their backup latch.

Since the selection of the value to retain as the backup copy is off of the critical path, time can be taken to ensure that the backup copy contains the correct value. By ensuring that this correct value is backed up in such a manner, at the sampling circuit level, this relaxes the previous time constraint for performing error detection and any associated error recovery, and in particular provides a full extra cycle for performing the required recovery.

By storing a backup copy in each sampling circuit, this in effect provides checkpointing at the sampling circuit level, and hence provides a checkpointing procedure without in-depth knowledge of the micro-architecture of the data processing apparatus. Hence, such an approach is largely design independent, with the decoupled backup copy ensuring correct machine state at the sampling circuit level. The operation of the processing logic can hence be recovered from the retained checkpointed copies of sampled data retained at the sampling circuit level.

Such an approach hence enables the performance benefits associated with the technique described in U.S. patent publication no. U.S. 2004-0199821 to be realised, whilst relaxing the timing constraints for performing error detection and associated error recovery within such a data processing apparatus.

The selected sampling circuits that are arranged to output the value stored in their backup latch during the error recovery procedure will be selected dependent on the implementation. However, in one embodiment, the error signal is a simple signal merely identifying the occurrence of an error, and not providing any additional information about the type of error, and in such embodiments the selected sampling circuits comprise each of the plurality of sampling circuits. Hence, in such embodiments, all sampling circuits that are arranged to keep a backup copy will be arranged during the recovery procedure to output as the sampled associated digital signal value the value stored in their backup latch.

In one embodiment, the at least one of the sampling circuits is operable to sample the value of the associated digital signal at the first time and at a second later time, and to store as the backup copy the value of the associated digital signal sampled at the second later time. The at least one of the sampling circuits is further operable to determine an occurrence of a timing error in the value of the associated digital signal sampled at the first time, and to issue the error signal upon determination of said timing error. In this embodiment, processing errors resulting from too early a sampling of the associated digital signal are corrected by the resampling of the digital signal at the second later time, at which stage it can be ensured that the digital signal has the correct value. This later sampled value is stored as the backup copy, and hence when the error recovery procedure is implemented will be output from the sampling circuit.

In one particular embodiment, the at least one of the sampling circuits is operable to determine the occurrence of the timing error by detecting a difference in the associated digital signal value as sampled at the first time and at the second later time. The second later time will typically be chosen to be a time that it can be guaranteed that the digital signal being sampled will be at a stable level, and accordingly any difference between the first sampled value and the second sampled value will indicate an error in the first sampled value.

In one particular embodiment, the at least one of the sampling circuits comprises a main latch operable to store the value of the associated digital signal sampled at the first time, a shadow latch operable to store the value of the associated digital signal re-sampled at the second later time value, and error detection logic operable to compare the values stored in the main latch and the shadow latch in order to determine the occurrence of the timing error. In such embodiments, the backup latch may be arranged to store as the backup copy the value stored in the shadow latch.

In one embodiment, the at least one of the sampling circuits is operable to determine an occurrence of a soft error in the value of the associated digital signal sampled at the first time, and to issue the error signal upon determination of said soft error, the at least one of the sampling circuits further being operable to determine from the sampled values one of the sampled values not incorporating the soft error and to cause that value to be stored as the backup copy.

The manner in which one of the sampled values not incorporating the soft error is determined can take a variety of forms. For example, in one embodiment, three or more samples of the digital signal value may be taken, with the value most consistently sampled being considered to be the one not containing the soft error. Alternatively, some filtering logic may be inserted in the path over which a second sample is taken, with the second sample being taken at the output of the filtering logic. The filtering logic can be arranged such that it only outputs a value once the input to the filtering logic has been stable for a predetermined period that would exceed that expected in the presence of a soft error, and accordingly by the time the second sampled value is taken, it can be assumed that that second sampled value does not include a soft error, and that accordingly that second sampled value can be stored as the backup copy. Since such a process occurs away from the critical path of the data processing apparatus (it does not delay output of a signal from the sampling circuit), the process can be performed without adversely affecting speed of operation of the data processing apparatus.

Clearly, when employing the above technique, it is only appropriate to seek correction of a soft error if that soft error has actually occurred in the value of the digital signal sampled at the first time, since it is that value that is initially output from the sampling circuit, and hence will be used by a further processing stage.

Whilst the data processing apparatus may include only a single sampling circuit that temporally samples the value of the associated digital signal at multiple times and is arranged to determine the occurrence of an error in the first sampled value, in other embodiments there are multiple of such sampling circuits provided, and the error recovery logic is operable in response to an error signal from any of the multiple sampling circuits to implement the recovery procedure.

Whilst in one embodiment each sampling circuit only includes a single backup latch, in other embodiments the plurality of sampling circuits comprise multiple backup latches operable to store backup copies of the associated digital signal value as sampled in multiple clock cycles, thereby enabling the recovery procedure to be implemented over said multiple clock cycles. This hence enables a further relaxation in the timing constraints for performing error detection and recovery.

The data processing apparatus may take a variety of forms. However, in one embodiment, the data processing apparatus is an integrated circuit.

Viewed from a second aspect, the present invention provides a data processing apparatus comprising: processing means for performing a data processing operation; a plurality of sampling means, each sampling means being located at a predetermined point in the processing means for sampling a value of an associated digital signal generated by the processing means at that predetermined point; each of said sampling means including a backup means for storing a backup copy of the associated digital signal value, and at least one of the sampling means being arranged to temporally sample the value of the associated digital signal at a first time and at at least one later time and to store as the backup copy a selected one of the sampled values representing a correct value, the value of the associated digital signal sampled at the first time being initially output from that sampling means; the at least one of the sampling means being arranged to determine an occurrence of an error in the value of the associated digital signal sampled at the first time, and to issue an error signal upon determination of said error, the data processing apparatus further comprising: error recovery means for implementing, in response to the error signal, a recovery procedure during which selected sampling means are operable to output as their sampled associated digital signal value the value stored in their backup means.

Viewed from a third aspect, the present invention provides a method of recovering from errors in a data processing apparatus having processing logic operable to perform a data processing operation, and a plurality of sampling circuits, each sampling circuit being located at a predetermined point in the processing logic and operable to sample a value of an associated digital signal generated by the processing logic at that predetermined point, the method comprising the steps of: storing in each of said sampling circuits a backup copy of the associated digital signal value; in at least one of the sampling circuits, performing the steps of: (a) temporally sampling the value of the associated digital signal at a first time and at at least one later time; (b) storing as the backup copy a selected one of the sampled values representing a correct value; (c) initially outputting the value of the associated digital signal sampled at the first time; (d) determining an occurrence of an error in the value of the associated digital signal sampled at the first time, and issuing an error signal upon determination of said error; in response to the error signal, implementing a recovery procedure during which selected sampling circuits output as their sampled associated digital signal value the value stored in their backup latch.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1A:
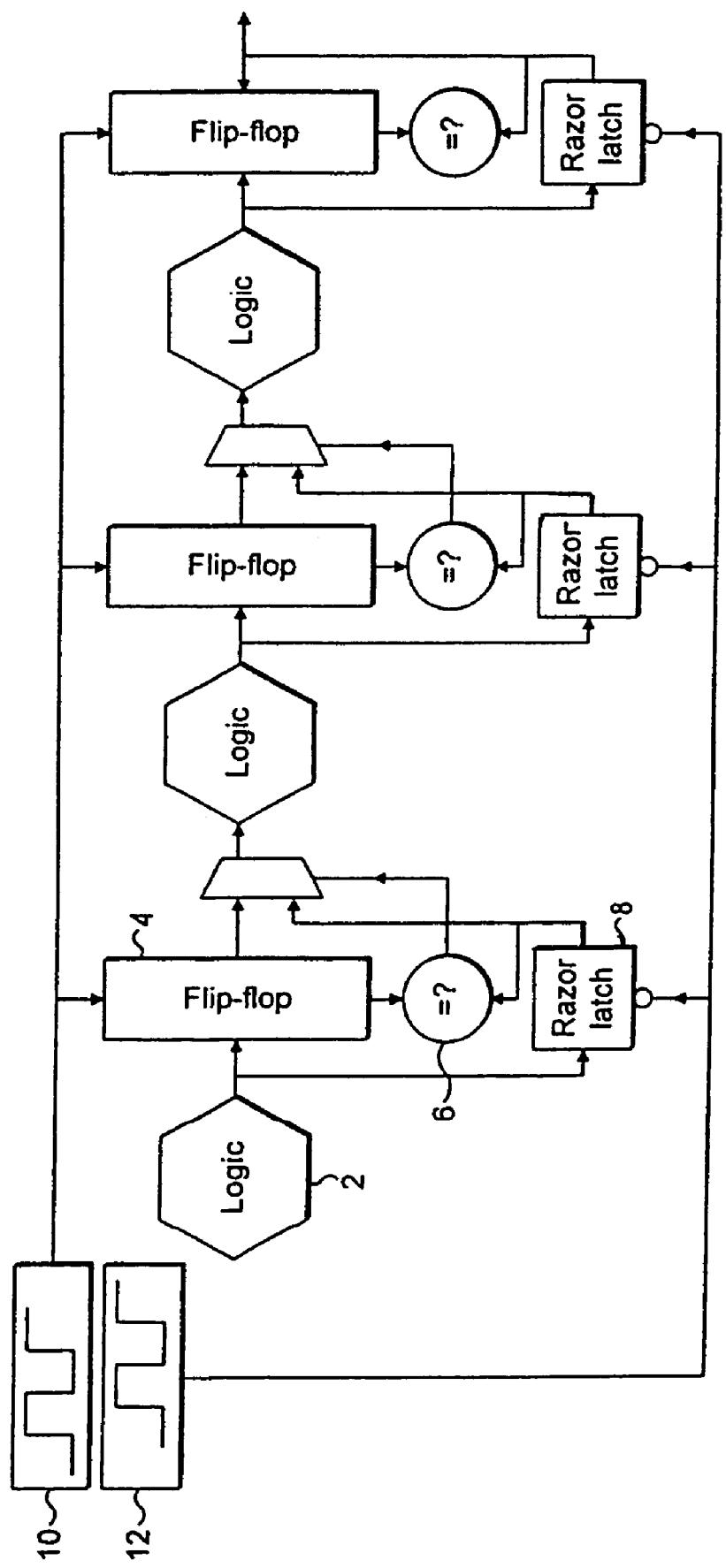
FIG. 1A schematically illustrates a plurality of processing stages to which the technique of embodiments of the present invention may be applied using a first clocking scheme.

FIG. 1A illustrates an example of a portion of a data processing apparatus in which the techniques of embodiments of the present invention may be applied. In particular, FIG. 1A illustrates a part of an integrated circuit, which may for example be a part of a synchronous pipeline within a processor core, such as an ARM processor core produced by ARM Limited of Cambridge, England. The synchronous pipeline is formed of a plurality of processing stages. The first stage comprises logic 2 followed by a non-delayed latch 4 in the form of a flip-flop together with a comparator 6 and a delayed latch 8. The term latch used herein encompasses any circuit element operable to store a signal value irrespective of triggering, clock and other requirements. Subsequent processing stages are similarly formed.

A non-delayed clock signal 10 drives the processing logic and non-delayed latches 4 within all of the processing stages to operate synchronously as part of a synchronous pipeline. A delayed clock signal 12 is supplied to the delayed latches 8 of the respective processing stages, the delayed latches being transparent (i.e. open) when the delayed clock signal is low (as indicated by the bubble at the clock input of those delayed latches in FIG. 1A). The delayed clock signal 12 is a phase shifted version of the non-delayed clock signal 10. The degree of phase shift controls the delay period between the capture of the output of the processing logic 2 by the non-delayed latch 4 and the capture of the output of the processing logic 2 at a later time performed by the delayed latch 8.

If the logic 2 is operating within limits given the existing non-delayed clock signal frequency, the operating voltage being supplied to the integrated circuit, the body bias voltage, the temperature, etc, then the logic 2 will have finished its processing operations by the time the non-delayed latch 4 is triggered to capture its value. Consequently, when the delayed latch 8 later captures the output of logic 2, this will have the same value as the value captured within the non-delayed latch 4. Accordingly, the comparator 6 will detect no change occurring during the delay period and error-recovery operation will not be triggered.

Conversely, if the operating parameters for the integrated circuit are such that the logic 2 has not completed its processing operation by the time that the non-delayed latch 4 captures its value, then the delayed latch 8 will capture a different value and this will be detected by the comparator 6, thereby forcing an error-recovery operation to be performed.

Figure 1B:
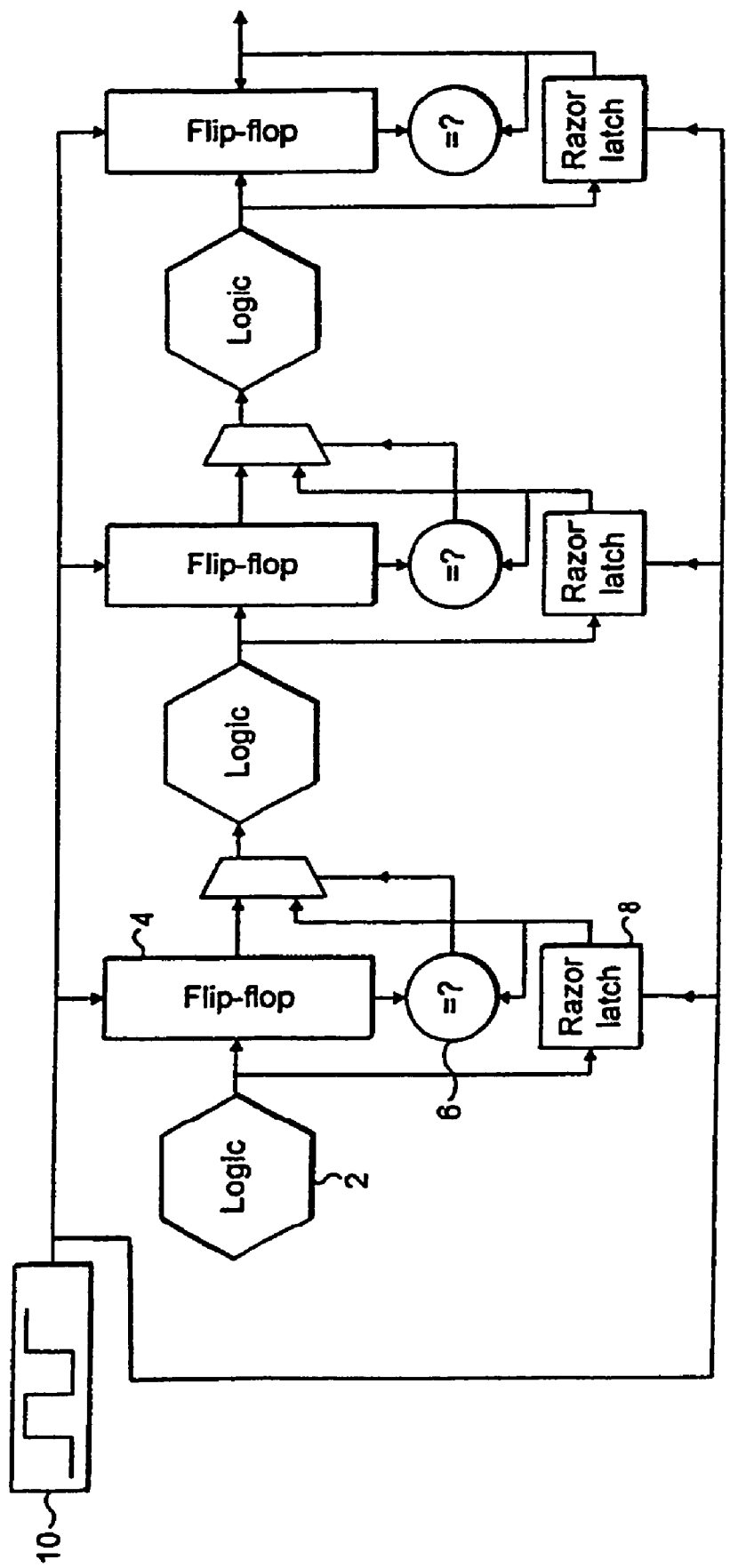
FIG. 1B schematically illustrates a plurality of processing stages to which the technique of embodiments of the present invention may be applied using a second clocking scheme.

FIG. 1B illustrates the same example portion of a data processing apparatus as shown in FIG. 1A, but in which an alternative clocking scheme is used which avoids the need for two different clocks. In accordance with the FIG. 1B approach, the delayed latches 8 are provided with the same non-delayed clock signal 10 as provided to the non-delayed latches 4, but are arranged to be transparent (i.e. open) when the clock signal is high. Whilst transparent, the value output from the delayed latch 8 corresponds to the value input to the delayed latch, and the delayed latch then samples the input value on the falling edge of the clock signal. This approach is hence equivalent to supplying the delayed latch 8 with a clock signal delayed by an entire phase, assuming that the mark-space ratio of the clock signal is 50:50 (i.e. both high and low phases of the clock signal are of equal length). For the purpose of describing the remaining FIGS. 2 to 8, it will be assumed that the clocking scheme of FIG. 1B is employed.

Commonly-assigned U.S. patent publication no. U.S. 2004-0199821, the content of which is hereby incorporated by reference, describes an example of an error detection and recovery technique which may be used within a data processing apparatus including circuitry such as that shown in FIG. 1A. However, in accordance with the techniques described therein, the error detection and recovery needs to performed within a single cycle, and in particular with up to half of the cycle being taken to detect the presence of errors, the remaining half cycle may be insufficient in future designs to enable full recovery to take place.

Figure 2:
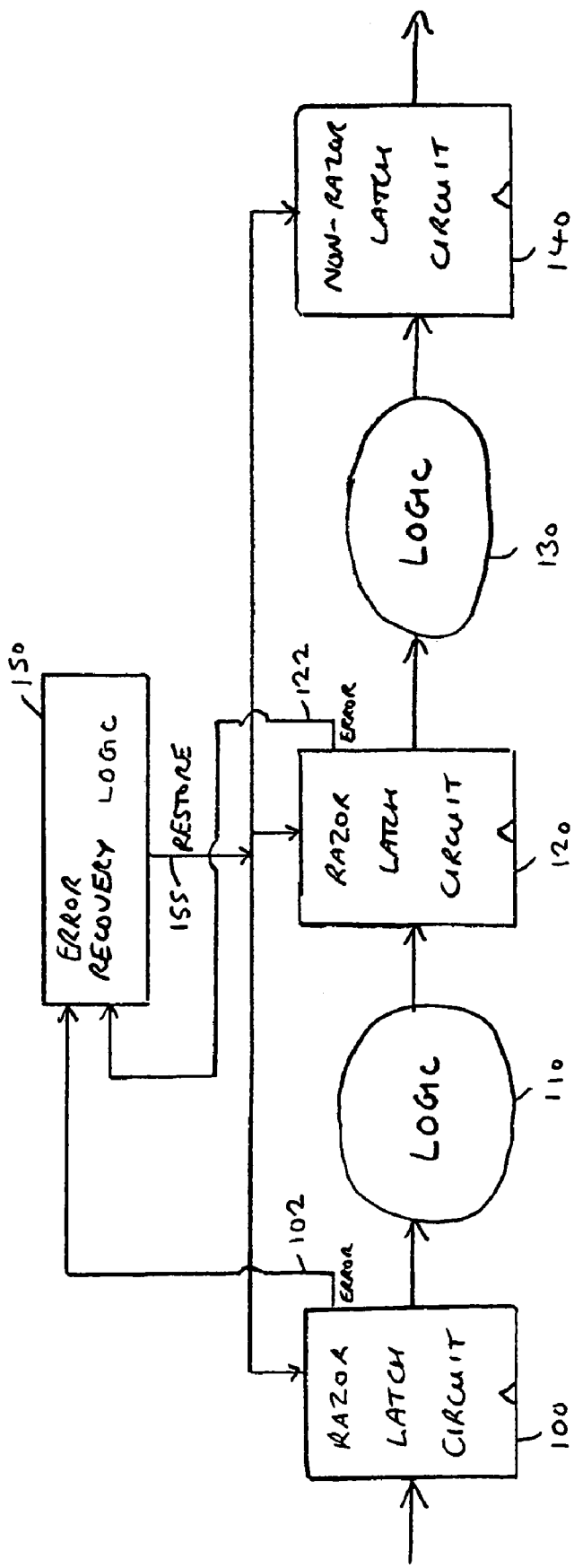
FIG. 2 illustrates a data processing apparatus incorporating a number of latch circuits in accordance with one embodiment of the present invention.
Figure 3:
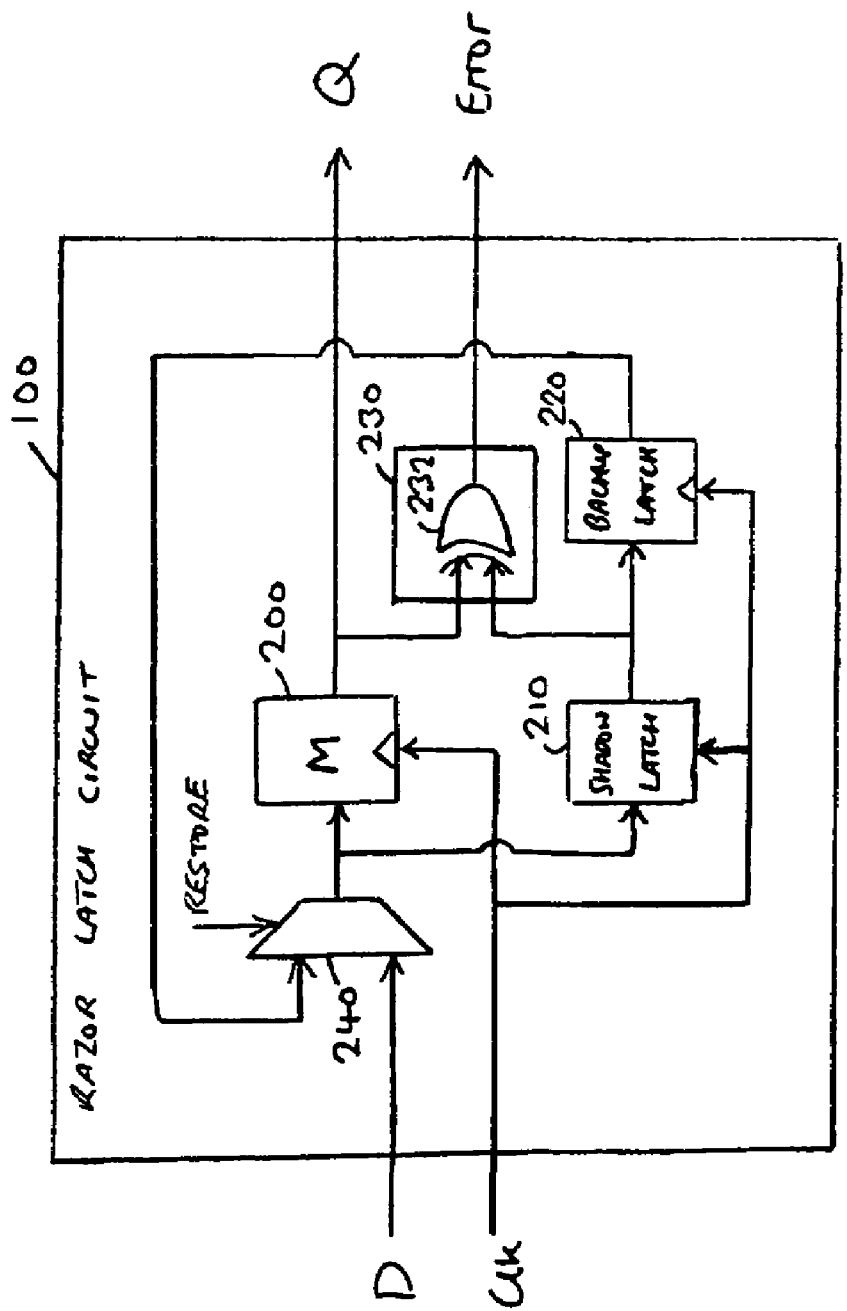
FIG. 3 is a block diagram illustrating in more detail the structure of the razor latch circuits of FIG. 2 in accordance with one embodiment.

FIG. 2 illustrates a portion of a data processing apparatus in accordance with one embodiment of the present invention, in which the time constraint for detecting errors and recovering from them is alleviated. The apparatus shown in FIG. 2 comprises a sequence of latch circuits 100, 120, 140, also referred to herein as sampling circuits, these various latch circuits being interconnected by logic 110, 130 arranged to perform particular data processing operations. The latch circuits 100, 120 referred to in FIG. 2 as "razor" latch circuits in one embodiment have the form illustrated in FIG. 3. As shown in FIG. 3, each razor latch circuit includes a main latch 200 for latching the value of an input digital signal D received by the latch circuit at a first time. In particular, in the example illustrated in FIG. 3, the main latch 200 is an edge-triggered latch which is arranged to latch the value of the signal D on the rising edge of the clock signal.

The razor latch circuit 100 also includes a shadow latch 210 which also receives the clock signal, but is arranged as a level sensitive latch so as to sample the value of the digital signal D at a second later time. In accordance with embodiments of the present invention, this latch circuit 100 is also provided with a backup latch 220 which is arranged on the rising edge of the clock signal to latch as a backup copy the content of the shadow latch 210.

The latch circuit 100 also provides error detection logic 230 for detecting the presence of an error in the value Q output from the main latch 200. In particular, the error detection logic 230 includes an exclusive OR gate 232 for detecting any discrepancy between the value output by the main latch 200 and the value output by the shadow latch 210, this being indicative of a processing error in the output from the main latch 200 resulting from the main latch 200 sampling the value of the digital signal D before the logic producing that value had completed its operation. The error detection logic 230 may also include other error detection logic, such as a meta-stability detector which serves to detect meta-stability in the output of the main latch 200, this also triggering generation of an error signal. As shown in FIG. 2, any error signal detected by a razor latch circuit 100, 120 is output over a corresponding path 102, 122 to error recovery logic 150.

As also shown in FIG. 3, a multiplexer 240 is provided at the input to the main latch 200, which receives as one of its inputs the digital signal D, and at its other input receives the contents of the backup latch 220. If the error recovery logic 150 determines based on the error signals received that a recovery process should be invoked, it will set a restore signal on path 155 which will be propagated to each of the latch circuits 100, 120, 140. As shown in FIG. 3, this restore signal will be received by the multiplexer 240 within each razor latch circuit 100, 120, and will cause the contents of the backup latch 220 to be propagated into the main latch 200 and also at some later time into the shadow latch 210. Since the backup copy in the backup latch 220 is the correct value, it will be seen that the latch circuit 100, 120 will then output the correct value Q. Also, it will be noted that since the main latch 200 and the shadow latch 210 will then contain the same data, the error signal will be de-asserted by the error detection logic 230.

Figure 4:
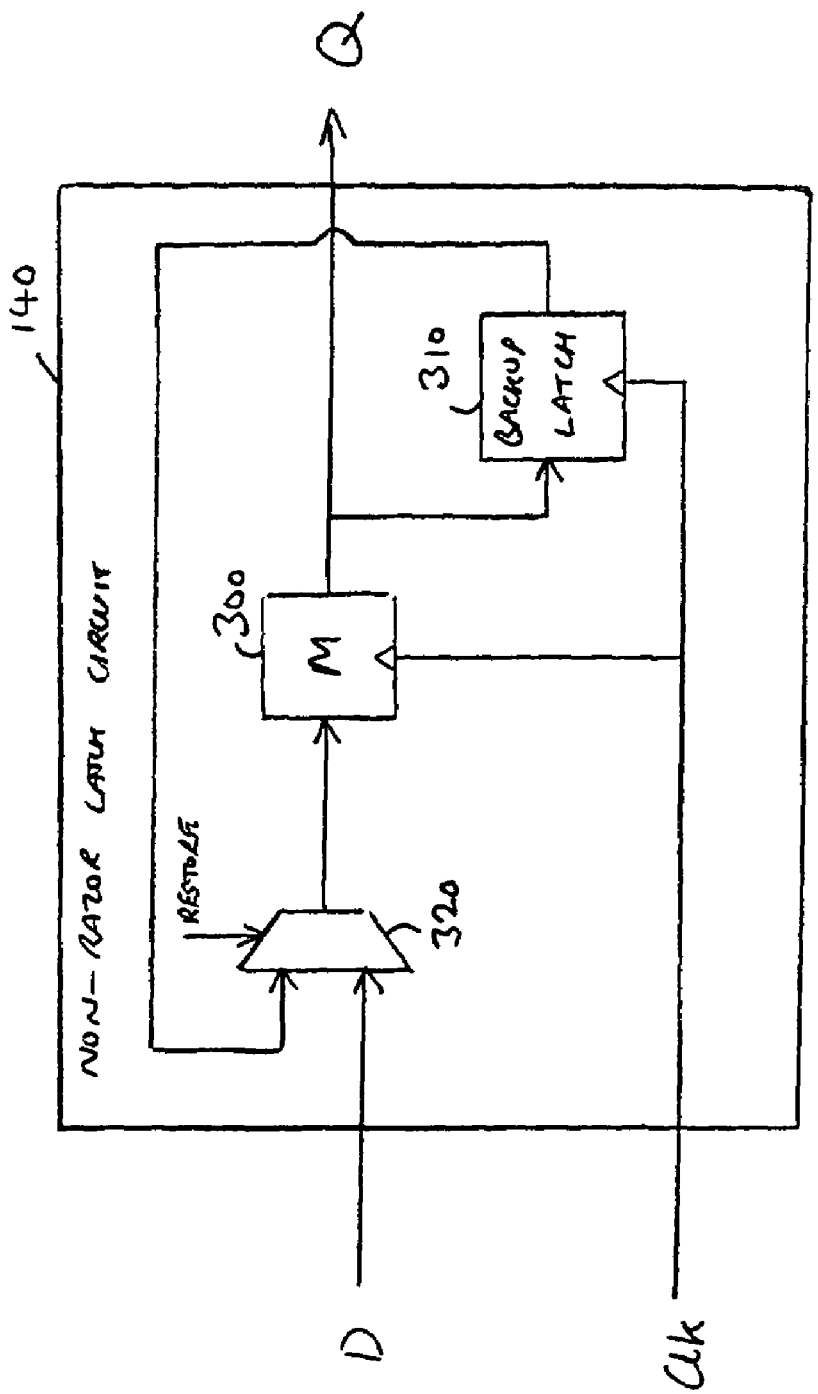
FIG. 4 is a block diagram illustrating in more detail the structure of the non-razor latch circuits of FIG. 2 in accordance with one embodiment.

FIG. 4 is a block diagram illustrating the elements provided within the non-razor latch circuit 140 of FIG. 2. Such a latch circuit 140 is used in situations where the logic producing the value input to that latch circuit is guaranteed to have had time to complete its operation and produce a stable output by the time that output is sampled by the latch circuit 140. Hence, the main latch 300 is arranged to sample the input data signal D on the rising edge of the clock signal, and it is known that this value will not include any processing errors. The latch then outputs as the digital signal Q the value that it has latched on the rising edge of the clock signal, and on the next rising edge of the clock signal that value is stored as a backup copy within the backup latch 310, which is also driven by the same clock signal. As with the razor latch circuit of FIG. 3, a multiplexer 320 is provided at the input to the main latch 300, which is arranged to receive as one of its inputs the input digital signal D, and is arranged to receive at its other input the output from the backup latch 310. Upon assertion of the restore signal over path 155 by the error recovery logic 150 of FIG. 2, the multiplexer 320 will be arranged to cause the content of the main latch 300 to be updated with the backup copy stored in the backup latch 310.

Accordingly, it can be seen that by arranging the razor latch circuits 100, 120 as shown in FIG. 3, and the non-razor latch circuits 140 as shown in FIG. 4, it can be ensured that upon detection of an error by one of the razor latch circuits, all of the latch circuits 100, 120 and 140 can be "wound back" to a point where the correct state is restored in each of the main latches of those latch circuits, thereby enabling the error to be corrected. Although such an error recovery process takes significant time when it occurs, it has been found that the impact on processing speed resulting from such a recovery process is far outweighed by the potential speed improvement resulting from operating the apparatus at a frequency that is so high, or a voltage that is so low, that processing errors do occasionally occur. Further, through the provision of a backup latch in each of the latch circuits 100, 120, 140, this relaxes the time constraint for detecting such errors and recovering from the errors, and in particular removes the requirement for error detection and recovery to occur within a single cycle.

Figure 5:
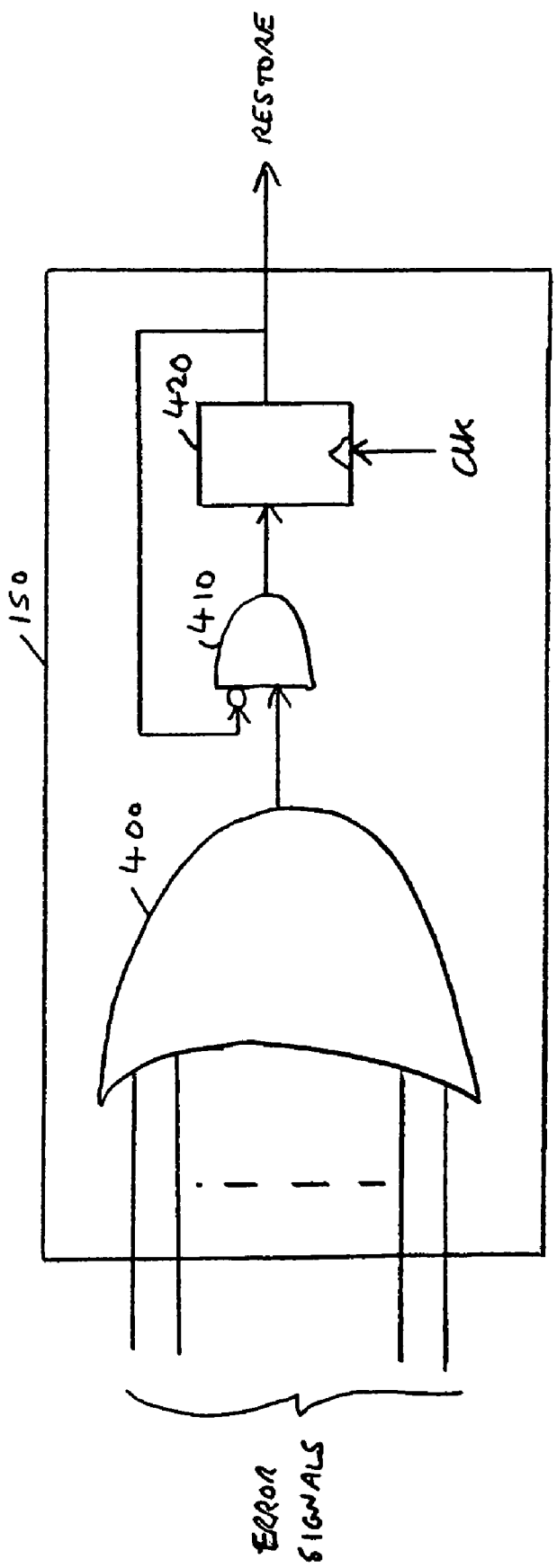
FIG. 5 is a block diagram illustrating in more detail the operation of the error recovery logic of FIG. 2 in accordance with one embodiment.

FIG. 5 is a block diagram illustrating some of the logic provided within the error recovery logic 150 of FIG. 2. In particular, an OR gate 400 is provided for receiving the error signals generated by any razor latch circuit in the apparatus, with the output from the OR gate being set whenever an error is detected by any such razor latch circuit. It will be appreciated that in practice the OR gate 400 may not be a single structural gate, but rather may be implemented by a sequence of gates. A latch 420 is arranged to store the output from the OR gate 400, but an AND gate 410 is interposed between the output from the OR gate 400 and the latch 420 to ensure that the restore signal is reset in the cycle following the cycle in which it is set.

In particular, the output from the latch 420 is fed back in an inverted version as one of the inputs to the AND gate 410. Hence, if the latch 420 contains a logic zero value, indicating that the restore operation is not being invoked, then this will prime one of the inputs to the AND gate to a logic one value. Accordingly, as soon as the OR gate 400 produces a logic one value indicating the presence of an error for which the recovery process needs to be invoked, this will cause that logic one value to be propagated to the latch 420, where it will be sampled on the rising edge of the clock. This causes the restore signal to be set to indicate that the restore operation is to be invoked. At this point, the logic one value in the latch is then routed back as a logic zero value to one input of the AND gate 410, which ensures that irrespective of the signal output from the OR gate in the next clock cycle, the latch 420 will latch a logic zero value on the next rising edge of the clock, thereby resetting the restore signal.

Figure 6:
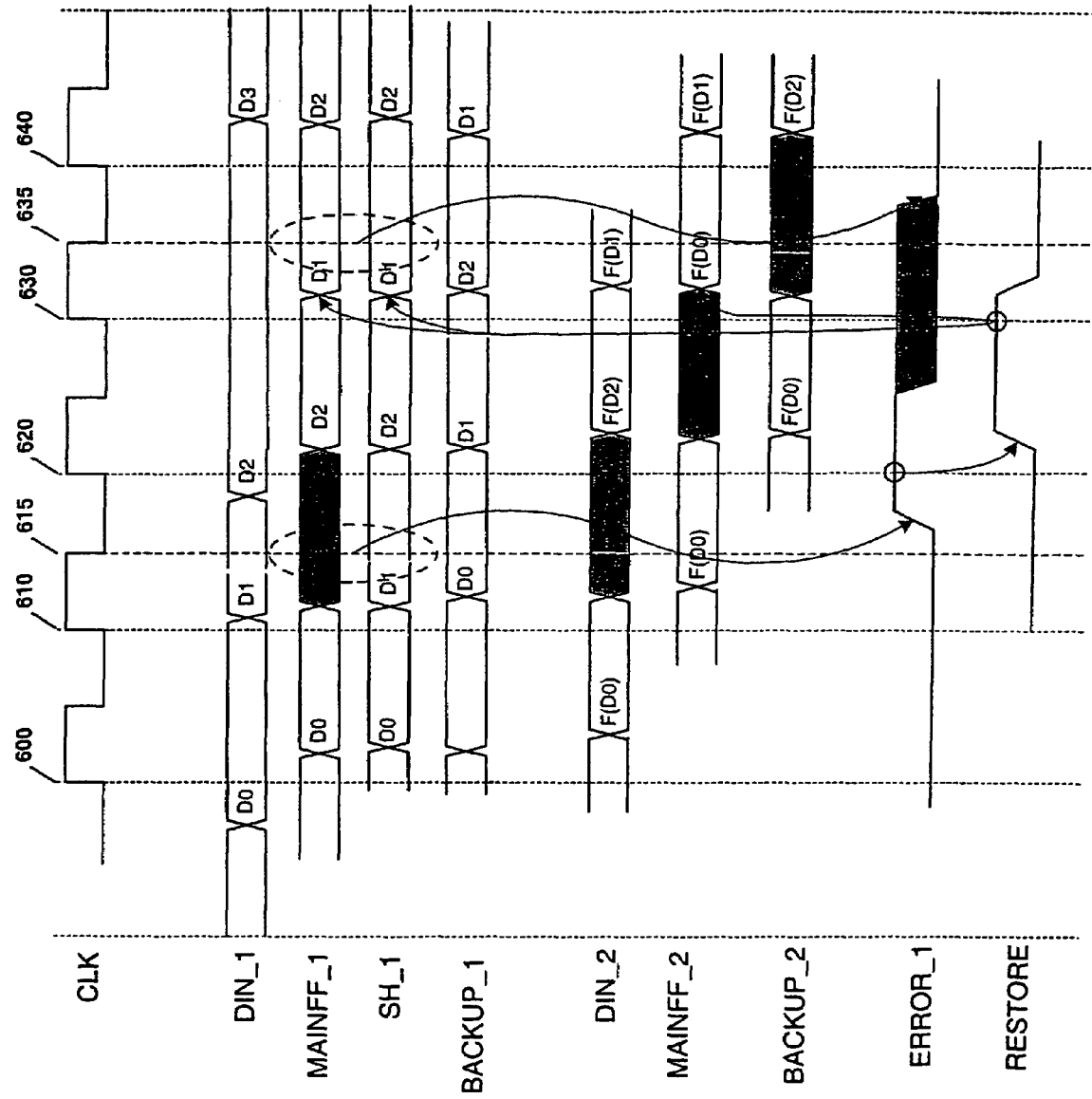
FIG. 6 is a timing diagram illustrating the error detection and recovery process in accordance with one embodiment of the present invention.
Figure 7:
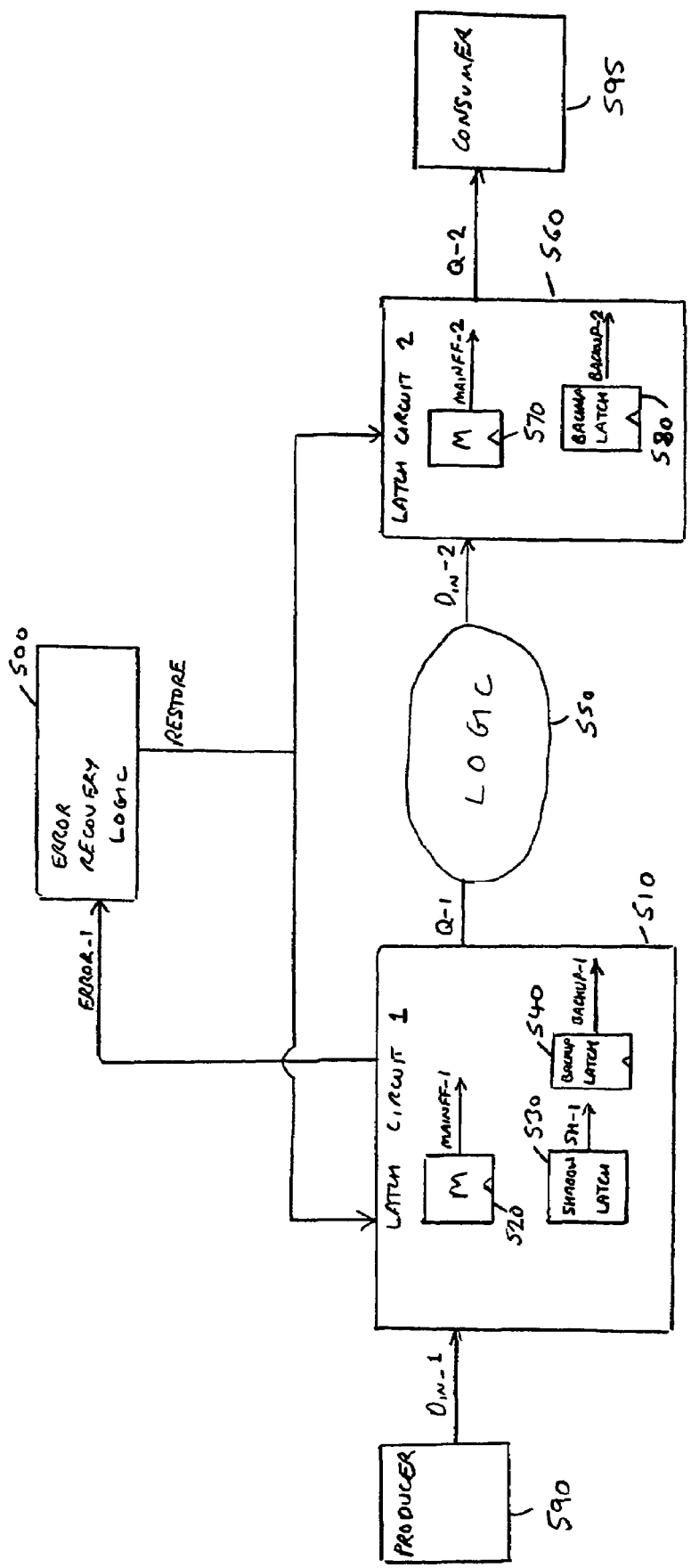
FIG. 7 is a block diagram illustrating the locations of the various signals referred to in FIG. 6.

FIG. 6 is a timing diagram illustrating the error detection and recovery process in accordance with one embodiment of the present invention, and FIG. 7 is a diagram schematically illustrating the various signals referred to in FIG. 6. FIG. 7 shows a simple example in which two latch circuits 510, 560 are separated by logic 550. The first latch circuit 510 is a razor latch circuit, and accordingly includes a main latch 520, a shadow latch 530 and a backup latch 540. As discussed earlier, such a latch circuit also includes error detection logic and is arranged to generate an error signal ("error-1") to error recovery logic 500 in the event of detection of an error. The second latch circuit 560 is non-razor latch circuit, and hence as discussed earlier with reference to FIG. 4 will include a main latch 570 and a backup latch 580. Both latch circuits 510, 560 are operable to receive a restore signal from the error recovery logic 500 in the event that the error recovery logic determines that a error recovery procedure needs to be invoked.

Also shown in FIG. 7 is a producer 590 responsible for producing the data input into the razor circuitry 510, 550, 560, 500, and a consumer 595 that receives the data output from that razor circuitry. Both the producer 590 and the consumer 595 need to be able to cope with the effect of an error detected by a razor latch circuit, and this requires that they are responsive to the error/restore signals. In particular, the producer 590 must be able to stall production of data when an error is detected by a razor latch circuit, until such time as the restore activity has completed. The consumer 595 can use the restore signal to determine if the data it is presented with is valid. If the restore signal is asserted this indicates that the data produced in the current and immediately following cycle is incorrect and must not be used.

The handling of an error detected by a razor latch circuit will now be discussed further with reference to FIG. 6. In FIG. 6, the terms D0, D1, D2, D3 represent particular signal values, and $D_{IN}$-2 has corresponding signal values related to the original values D0 to D3 by a function "F", this function being implemented by the logic 550. Where a razor error results in an incorrect value this is shown in FIG. 6 by the relevant signal value being greyed out.

As shown in FIG. 6, on the rising edge 600 of a first clock cycle, the signal $D_{IN}$-1 is asserting valid data D0. The data value D0 will be sampled by the main latch 520 on the rising edge 600 of the first clock cycle, and will accordingly result in the output of the signal MAINFF-1 shortly after that rising edge. During the whole of the following clock cycle until the next rising edge 610, the main latch 520 will output the value that it sampled on the rising edge 600 of the first clock cycle.

In contrast, the shadow latch 210 is a level sensitive latch, and accordingly its output SH-1 varies dynamically with the input received as signal $D_{IN}$-1 during the first half of the clock cycle, with the value then being sampled on the falling edge of the clock. Accordingly, the output SH-1 from the shadow latch 530 will transition to the value D0 some time following the rising edge of the clock signal.

As discussed earlier with reference to FIG. 3, the backup latch 540 samples on the rising edge of the clock signal the contents of the shadow latch 530, resulting in the output signal BACKUP-1.

Considering now the second latch circuit 560, the input signal $D_{IN}$-2 will represent a valid data value F(D0) some time during the first clock cycle, the exact time at which that data value is produced being dependent on the time taken to process the D0 input value within the combinational logic 550. On the rising edge 610 of the second clock cycle, this data value F(D0) is latched by the main latch 570 and output as a signal MAINFF-2. The backup latch 580, as discussed earlier with reference to FIG. 4, latches the contents of the main latch 570 on the rising edge of the clock cycle, and accordingly its contents at any point in time reflect the contents of the main latch 570 in the preceding cycle, resulting in the signal BACKUP-2.

Considering again the signal $D_{IN}$-1, the production of data value D1 is delayed, and hence on the rising edge 610 of the second clock cycle, the main latch 520 samples an invalid value. This invalid value may be the wrong value (i.e. the old D0 value) or an invalid (intermediate) voltage level which does not correspond to either a logic 0 or a logic 1 level. However, since the shadow latch 530 is a level sensitive latch, its output will transition to the value D1 shortly after the signal $D_{IN}$-1 transitions to the value D1, and accordingly at the falling edge 615 of the second clock cycle, the error detection logic within the latch circuit 510 will detect a discrepancy between the contents of the main latch 520 and the shadow latch 530, and will accordingly cause the error signal ERROR-1 to be asserted shortly thereafter.

With regard to the second latch circuit 560, the data value of the signal $D_{IN}$-2 produced during the second clock cycle will also be invalid, due to the invalid value sampled by the main latch 520 of the first latch circuit, and hence output to the logic 550. Accordingly the main latch 570 will sample an invalid value on the rising edge 620 of the third clock cycle and will output that invalid value during the third clock cycle. Further, during the third clock cycle, the backup latch 580 will output the previous contents of the main latch 570, namely F(D0).

During the remainder of the second clock cycle, the ERROR-1 signal will be routed via the OR gate 400 and AND gate 410 of FIG. 5 to cause a logic one value to be latched in the latch 420 of the error recovery logic 500 on the rising edge 620 of the third clock cycle.

The error recovery logic 500 then needs to generate a restore signal ("RESTORE") which is fanned out to each latch circuit, and typically there will be significantly more latch circuits than the two latch circuits shown in FIG. 7. This results in significant delay between the restore signal generated by the error recovery logic and the restore control inputs to the latch circuits.

By the rising edge 620 of the third clock cycle, the value of the signal $D_{IN}$-1 has transitioned to the value D2, and accordingly this will be sampled by the main latch 520 at that time and output as the signal MAINFF-1 shortly following the rising edge. Further, the shadow latch 530 will also latch the value D2 at some point following the transition of the signal $D_{IN}$-1 to the value D2. As a result, the signal $D_{IN}$-2 will output the value F(D2) some time during the third clock cycle.

On the rising edge 630 of the fourth clock cycle, the set restore signal will cause the main latch 520 of the latch circuit 510 to store the correct data value D1, since the set restore signal will have caused the multiplexer in the latch circuit 510 to have fed to the input of the main latch 520 the current contents of the backup latch 540, which on the rising edge 630 still represents the data D1. The shadow latch 530 will then latch the value D1 during the first part of the fourth clock cycle.

A similar process will occur within the second latch circuit 560 to cause the main latch 570 of that circuit to store the data value F(D0). The backup latch 580 will during the fourth clock cycle store the invalid data stored in the main latch 570 during the third cycle.

Due to the earlier described operation of the error recovery logic 500, the restore signal will be de-asserted one clock cycle after it is asserted, as shown in FIG. 6.

The ERROR-1 signal is only valid for one cycle, and in the following cycle could be at a logic 0 level, at a logic 1 level, or at an invalid logic level (because this is a function of the timing of data in the next cycle). For the cycle where the ERROR_1 signal is invalid, the ERROR_1 signal is shown as greyed out in FIG. 6. The guaranteed de-assertion of the ERROR_1 signal is achieved by restoring the master 520 and shadow 530 latches to the same value (in this example D1) via the set RESTORE signal, this correspondence being detected by the error detection logic within the first latch circuit 510 on the falling edge 635 of the fourth clock cycle.

Hence, it can be seen from FIG. 6 that, following detection of an error in the first latch circuit 510 in a particular clock cycle, the error recovery logic 500 causes both latch circuits 510, 560 to perform an error recovery process, during which the main latches 520, 570 in both latch circuits 510, 560 are restored to the correct data values appropriate for that clock cycle. Having particular regard to the first latch circuit 510, the actual data value supplied to the main latch 520 comes from the backup latch 540, which in turn has obtained its value from the shadow latch 530, which as discussed earlier will hold the correct value required to ensure correct operation, and accordingly the processing error detected previously will have been removed.

Figure 8:
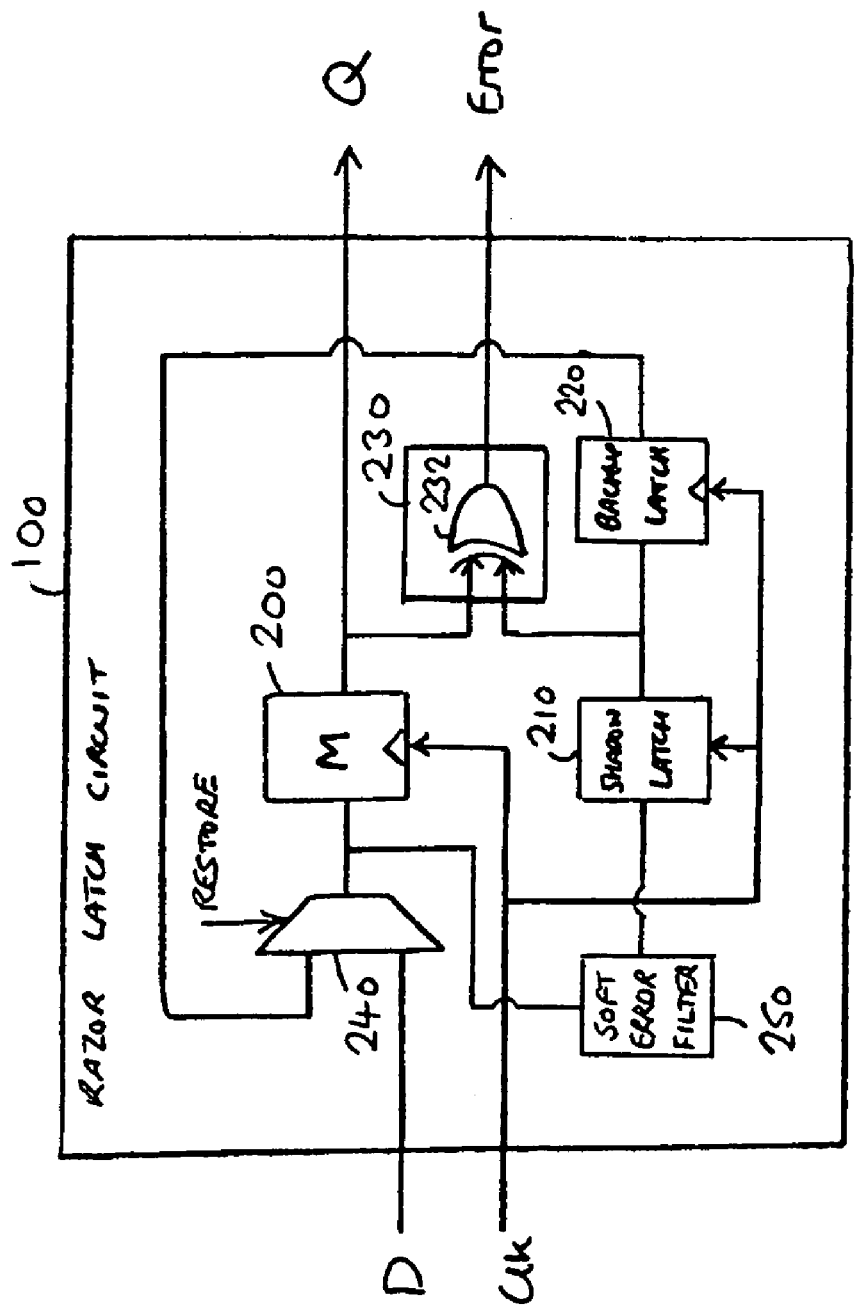
FIG. 8 is a block diagram illustrating an alternative embodiment of the razor latch circuits of FIG. 2.

FIG. 8 illustrates an alternative embodiment of the razor latch circuit 100 of FIG. 3, where additional filtering logic 250 is provided prior to the input to the shadow latch 210 to enable the removal of any soft error in the sample to be taken by the shadow latch 210. As will be appreciated from a comparison of FIG. 8 with the earlier-described FIG. 3, the remainder of the latch circuit is unchanged.

The soft error filter logic 250 can operate in a variety of ways. For example, in one embodiment the soft error filter 250 may be arranged to produce a time-delayed output based on its input, such that an output signal is only produced once the input signal has been stable for a predetermined period, this predetermined period being chosen to exceed that period of time over which a soft error may be observed. By this approach, it can be ensured that any soft error is suppressed, and hence that the value stored in the shadow latch 210 does not exhibit any soft error. By this approach, if a soft error was present in the value as stored in the main latch 200, there will be a discrepancy detected by the error detection logic 230, hence causing propagation of an error signal, which in turn will result in the earlier-described error recovery processing being invoked. Since the result of the error recovery process will be that the master latch 200 will be restored to a value obtained from the backup latch 220, which in turn is derived from the shadow latch 210, then it can be seen that this restored value will be a value in which the soft error is not present, and accordingly this will enable the data processing apparatus to recover from the soft error.

In an alternative embodiment, the soft error filter logic 250 can be arranged to itself take a sequence of temporal samples, and to select as its output that value most frequently found in the samples, such a process hence reducing the likelihood that the value stored in the shadow latch 210 contains a soft error. Although time is needed for the operations performed by the soft error filter 250, this time is not required on the critical path, and in particular does not delay output of a signal from latch circuit 100.

From the above description, it will be appreciated that the technique of embodiments of the present invention provides a sampling circuit level checkpointing approach, which splits error detection and recovery into two phases by employing-backup latches at the sampling circuit level. This enables an additional cycle to be provided for performance of error detection and subsequent error recovery, and accordingly alleviates the timing constraint observed in previous systems. In an alternative embodiment, multiple backup latches may be provided thereby enabling the recovery procedure to be implemented over multiple clock cycles. This may be useful in particularly complex systems where the global recovery signal needs to be propagated to a large number of sampling circuits.

A significant benefit of the proposed approach is that it provides checkpointing at the sampling circuit level, which does not require in-depth knowledge of the microarchitecture of the data processing apparatus. Accordingly, such an approach is largely design independent, and regardless of any particular design, the decoupled backup copy ensures correct machine state at the sampling circuit level, and hence ensures that the data processing apparatus can recover from an error detected at a particular sampling circuit.

In accordance with the techniques of embodiments of the present invention, the data processing apparatus can be run at operating frequencies and/or voltages which are likely to induce processing errors due to an early sampling of outputs from particular processing stages, but which provides a mechanism to enable such errors to be detected and recovered from in a controlled manner. This provides significant performance benefits over more conservative prior art approaches where signals are not sampled until such time as it is ensured that the processing stage producing those signals will have finished its operation. Further, with regard to soft errors, steps can be taken away from the critical path to remove these soft errors, and the same error detection and recovery mechanism can be used to then recover from any soft errors present in the initially sampled value.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A data processing apparatus comprising:
   processing logic operable to perform a data processing operation;
   a plurality of sampling circuits, each sampling circuit being located at a predetermined point in the processing logic and operable to sample a value of an associated digital signal generated by the processing logic at that predetermined point;
   each of said sampling circuits including a backup latch operable to store a backup copy of the associated digital signal value, and at least one of the sampling circuits being operable to temporally sample the value of the associated digital signal at a first time and at at least one later time and to store as the backup copy a selected one of the sampled values representing a correct value, the value of the associated digital signal sampled at the first time being initially output from that sampling circuit;
   the at least one of the sampling circuits being operable to determine an occurrence of an error in the value of the associated digital signal sampled at the first time, and to issue an error signal upon determination of said error, the data processing apparatus further comprising:
   error recovery logic operable in response to the error signal to implement a recovery procedure during which selected sampling circuits are operable to output as their sampled associated digital signal value the value stored in their backup latch.

2. A data processing apparatus as claimed in claim 1, wherein the selected sampling circuits comprise each of the plurality of sampling circuits.

3. A data processing apparatus as claimed in claim 1, wherein:
   the at least one of the sampling circuits is operable to sample the value of the associated digital signal at the first time and at a second later time, and to store as the backup copy the value of the associated digital signal sampled at the second later time;
   the at least one of the sampling circuits is operable to determine an occurrence of a timing error in the value of the associated digital signal sampled at the first time, and to issue the error signal upon determination of said timing error.

4. A data processing apparatus as claimed in claim 3, wherein the at least one of the sampling circuits is operable to determine the occurrence of the timing error by detecting a difference in the associated digital signal value as sampled at the first time and at the second later time.

5. A data processing apparatus as claimed in claim 4, wherein the at least one of the sampling circuits comprises a main latch operable to store the value of the associated digital signal sampled at the first time, a shadow latch operable to store the value of the associated digital signal re-sampled at the second later time value, and error detection logic operable to compare the values stored in the main latch and the shadow latch in order to determine the occurrence of the timing error.

6. A data processing apparatus as claimed in claim 5, wherein the backup latch is operable to store as the backup copy the value stored in the shadow latch.

7. A data processing apparatus as claimed in claim 1, wherein the at least one of the sampling circuits is operable to determine an occurrence of a soft error in the value of the associated digital signal sampled at the first time, and to issue the error signal upon determination of said soft error, the at least one of the sampling circuits further being operable to determine from the sampled values one of the sampled values not incorporating the soft error and to cause that value to be stored as the backup copy.

8. A data processing apparatus as claimed in claim 1, wherein the at least one of the sampling circuits comprises multiple of said plurality of sampling circuits, and the error recovery logic is operable in response to an error signal from any of said multiple sampling circuits to implement the recovery procedure.

9. A data processing apparatus as claimed in claim 1, wherein the plurality of sampling circuits comprises multiple backup latches operable to store backup copies of the associated digital signal value as sampled in multiple clock cycles, thereby enabling the recovery procedure to be implemented over said multiple clock cycles.

10. An integrated circuit, comprising a data processing apparatus as claimed in claim 1.

11. A data processing apparatus comprising:
    processing means for performing a data processing operation;
    a plurality of sampling means, each sampling means being located at a predetermined point in the processing means for sampling a value of an associated digital signal generated by the processing means at that predetermined point;
    each of said sampling means including a backup means for storing a backup copy of the associated digital signal value, and at least one of the sampling means being arranged to temporally sample the value of the associated digital signal at a first time and at at least one later time and to store as the backup copy a selected one of the sampled values representing a correct value, the value of the associated digital signal sampled at the first time being initially output from that sampling means;
    the at least one of the sampling means being arranged to determine an occurrence of an error in the value of the associated digital signal sampled at the first time, and to issue an error signal upon determination of said error, the data processing apparatus further comprising:
    error recovery means for implementing, in response to the error signal, a recovery procedure during which selected sampling means are operable to output as their sampled associated digital signal value the value stored in their backup means.

12. A method of recovering from errors in a data processing apparatus having processing logic operable to perform a data processing operation, and a plurality of sampling circuits, each sampling circuit being located at a predetermined point in the processing logic and operable to sample a value of an associated digital signal generated by the processing logic at that predetermined point, the method comprising the steps of:
    storing in each of said sampling circuits a backup copy of the associated digital signal value;
    in at least one of the sampling circuits, performing the steps of:
    (a) temporally sampling the value of the associated digital signal at a first time and at at least one later time;
    (b) storing as the backup copy a selected one of the sampled values representing a correct value;
    (c) initially outputting the value of the associated digital signal sampled at the first time;
    (d) determining an occurrence of an error in the value of the associated digital signal sampled at the first time, and issuing an error signal upon determination of said error;
    in response to the error signal, implementing a recovery procedure during which selected sampling circuits output as their sampled associated digital signal value the value stored in their backup latch.

* * * * *